United States Patent
Nishri

[11] Patent Number: 5,818,384
[45] Date of Patent: Oct. 6, 1998

[54] APPARATUS FOR AND METHOD OF CONTROLLING AND CALIBRATING THE PHASE OF A COHERENT SIGNAL

[75] Inventor: Ezra Nishri, Misgav, Israel

[73] Assignee: State of Israel-Ministry of Defense Armament Development Authority-Rafael, Haifa, Israel

[21] Appl. No.: 776,631
[22] PCT Filed: Jul. 7, 1996
[86] PCT No.: PCT/IL96/00041
§ 371 Date: Jan. 29, 1997
§ 102(e) Date: Jan. 29, 1997
[87] PCT Pub. No.: WO97/05501
PCT Pub. Date: Feb. 13, 1997

[30] Foreign Application Priority Data

Jul. 26, 1995 [IL] Israel ........................................ 114746

[51] Int. Cl.[6] .............................. H03L 7/07; H03B 21/00
[52] U.S. Cl. ........................................................... 342/174
[58] Field of Search ..................................... 342/174, 169, 342/171, 172, 173; 331/2; 343/2

[56] References Cited

U.S. PATENT DOCUMENTS

| 4,818,064 | 4/1989 | Youngquist et al. | 350/96.15 |
| 5,019,793 | 5/1991 | McNab | 333/156 |
| 5,408,201 | 4/1995 | Uriya | 331/2 |
| 5,518,400 | 5/1996 | Otoide et al. | 342/169 |

Primary Examiner—Daniel T. Pihulic
Attorney, Agent, or Firm—Mark M. Friedman

[57] ABSTRACT

The apparatus for and method of generating a coherent signal whose amplitude, frequency and phase can be accurately controlled. A first and second signal are synthesized digitally in response to separate frequency and phase input data. The second synthesized signal is heterodyned with a coherent oscillator signal. This heterodyned signal, in turn, is heterodyned with the first synthesized signal to produce a coherent signal generator output. The amplitude of the generator output signal may be varied in accordance with attenuation input data. A phase modulator provides phase shift key modulation of the output signal in accordance with a phase control signal. In addition, a switch gates the output of the final mixer under control of a switch control circuit which determines the pulse width and timing of the signal generator output.

15 Claims, 3 Drawing Sheets

APPARATUS FOR AND METHOD OF CONTROLLING AND CALIBRATING THE PHASE OF A COHERENT SIGNAL

FIELD AND BACKGROUND OF THE INVENTION

The present invention relates to an apparatus for and method of generating a coherent signal whose amplitude, frequency and phase can be accurately controlled.

Generally, in the development of a modern complex system such as a radar system, employing sophisticated high technology, it becomes necessary to simulate part of the real world the system is ultimately designed to work in. Simulation of a system, or part thereof, is useful because the necessity of supplying actual physical real world conditions is avoided. Simulation also provides the system designer a much lower cost alternative for approximating real world conditions. The most common use of simulation systems or simulators is in the testing of systems whereby testing without the use of a simulator would be either too cost prohibitive or impossible. In addition, the accuracy of software simulation is limited as compared to live testing.

Simulation systems are virtually a required component in the design and development of complex systems in such fields as radar and communications. For example, the design of radar and communication systems typically employ coherent signals in their design. The development of such systems typically requires the capability to simulate coherent signals for testing purposes. It would be virtually impossible to test these systems during development without the use of simulation equipment.

For example, coherent moving target indicator (MTI) radars or coherent pulse doppler radars typically employ coherent detection to determine the doppler frequency shift caused by a moving target. The doppler frequency shift of a moving target is directly related to its speed. In a coherent radar system the same oscillator signal used to generate the transmitted signal is used as the reference signal in the receiver section of the radar. Thus, the received echo signal from the target is always coherent with the internal reference signal used to determine the speed of the target.

The requirements of a radar target simulator and, more specifically, the signal generator portion thereof, include accurate control of the amplitude, frequency and phase of the simulated echo return signal. In addition, the simulated echo return signal must be coherent with the signal transmitted by the radar. Amplitude control of the simulated target signal is necessary because the echo return signal almost always has a lower amplitude due to wave propagation and due to the reflection characteristics of the target. Frequency control is required because the frequency of the return echo signal from a moving target is different from the frequency of the transmitted radar signal. This difference is due to the motion of the target and is called the doppler frequency. In addition, it is desirable to be able to control the phase of the simulated echo return signal for a variety of reasons. For example, moving targets may cause not only a frequency shift but may also cause a phase shift in the echo return signal. In addition, it might be desirable to stress the radar receiver section, including its signal processing capabilities, by phase shifting the return signal in certain ways.

An additional common systems requirement is calibration or compensation of electrical components in a circuit. Often, it is desirable to be able to calibrate or compensate a device for certain conditions or parameters.

A coherent signal generator is disclosed in German patent application 3145532. A local oscillator having a frequency $f_1$ is mixed with a coherent oscillator signal $f_0$. The resultant signal is filtered, amplified and heterodyned with a second local oscillator signal having a frequency equal to the sum of frequency $f_1$ and a doppler frequency shift $f_D$. The resultant mixer output signal is filtered and constitutes the output of the signal generator. Although the frequency component of the output signal can be controlled to simulate doppler shifts, there is no provision for controlling the phase of the output signal.

SUMMARY OF THE INVENTION

The present invention overcomes the disadvantages and limitations of the prior art by providing an apparatus and method of generating a coherent output signal whose amplitude, frequency and phase can be accurately controlled. Phase accuracy on the order of millidegrees is achieved by incorporating input phase data into a synthesized signal having a relatively low frequency before the signal is mixed up to relatively high radio frequencies (RF).

Hence, there is provided according to the teachings of the present invention, a coherent signal generator comprising a first and second frequency synthesizer for producing a first and second synthesizer signal, respectively, the first and second frequency synthesizer for controlling the frequency and phase characteristics of the first and second synthesizer signal, respectively, a first mixer coupled to a coherent signal source and the second frequency synthesizer, the first mixer for heterodyning the coherent reference signal produced by the coherent signal source with the second synthesizer signal thereby producing a first mixer signal, and a second mixer coupled to the first frequency synthesizer and the first mixer, the second mixer for heterodyning the first synthesizer signal with the first mixer signal thereby producing a signal coherent with the coherent reference signal.

While the invention has been described with respect to a limited number of embodiments, it will be appreciated that many variations, modifications and other applications of the invention may be made.

BRIEF DESCRIPTION OF THE DRAWINGS

The invention is herein described, by way of example only, with reference to the accompanying drawings, wherein.

DESCRIPTION OF THE PREFERRED EMBODIMENT

The present invention is of an apparatus for and method of accurately controlling and calibrating the phase of a coherent signal.

The principles and operation of the present invention may be better understood with reference to the drawings and the accompanying description.

Figure 1:
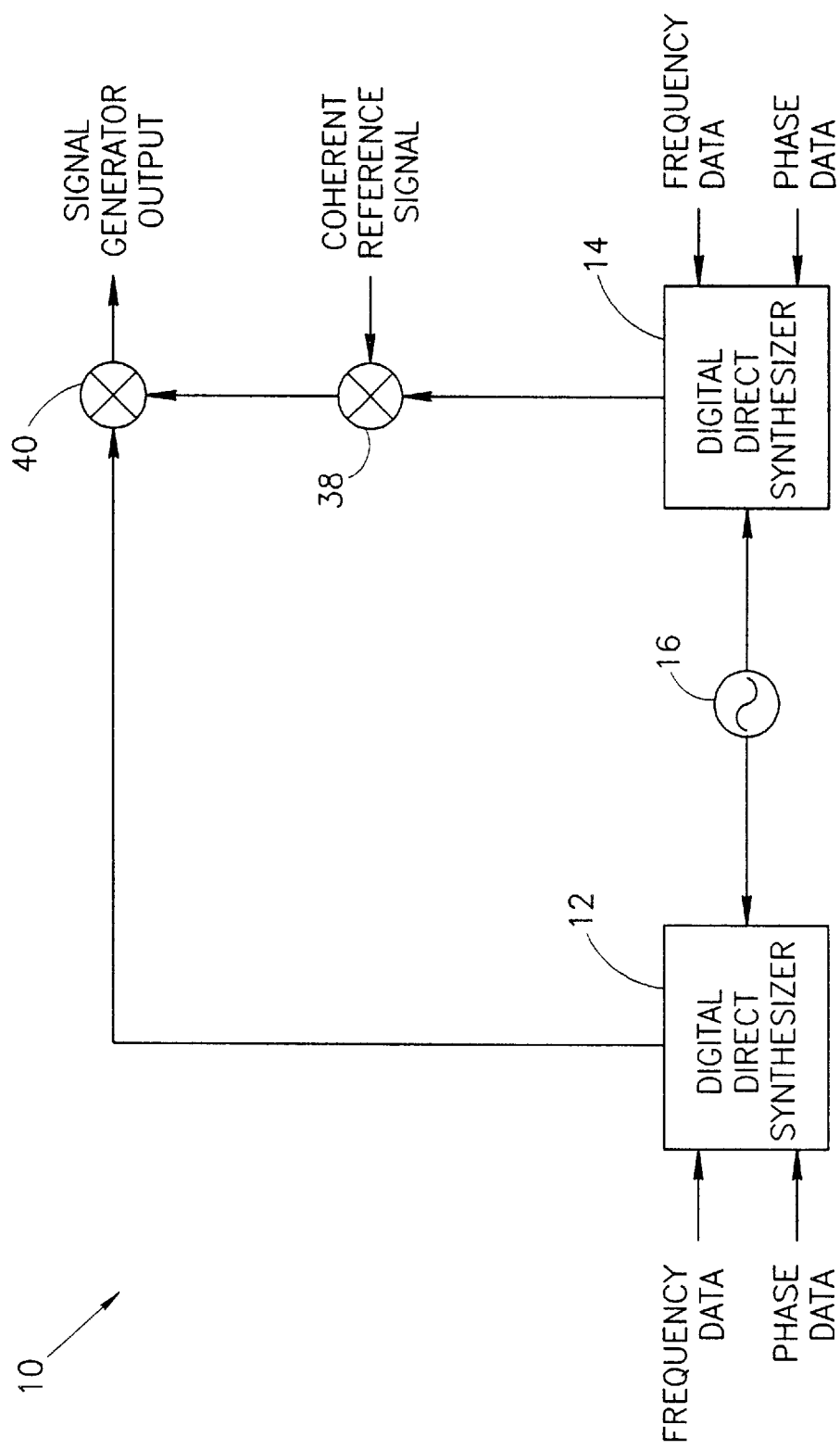
FIG. 1 is a block diagram of an embodiment of the present invention.

A block diagram of an embodiment of the present invention is shown in FIG. 1. At the core of coherent signal generator device 10 are digital direct synthesizers (DDS) 12, 14. DDS 12, 14 are digital synthesizers, identical in form, for generating either an analog or digital signal whose frequency and phase can be accurately controlled. Digital frequency and phase data are input to both DDS 12, 14. Both DDS 12, 14 are clocked by a signal produced by an oscillator 16. The digital frequency and phase data input to DDS 14 do not vary during operation of device 10 once device 10 has been calibrated. The digital frequency and phase data input to DDS 12, 14 may be supplied by a computer. The frequency of the signal input to DDS 12 is the sum of the frequency input to DDS 14 plus the desired frequency shift (i.e. doppler frequency shift) to be present in the signal output by device 10. Thus, for example, in the case of an MTI radar, the difference between the frequencies of the signals generated by DDS 12, 14 represents the doppler frequency of the desired simulated echo return signal. In addition, the phase of the synthesized signal from DDS 12 can be accurately controlled by varying the digital phase data input thereto. DDS 12, 14 synthesize signals having a phase resolution on the order of millidegrees. Digital to analog (D/A) converters incorporated in DDS 12, 14 convert the internal synthesized digital signal to an analog signal. The signal output from DDS 14 has a frequency $f_{IF}$. The signal output from DDS 12 has a frequency $f_{IF}+f_D$. Frequency $f_D$ represents the doppler frequency shift caused by the moving target which is to be simulated.

The signal output from DDS 14 is heterodyned with a coherent reference signal (COHO) by a mixer 38. The heterodyning process generates a signal having two frequency components representing the sum and difference of the frequencies of two input signals. The COHO signal is typically generated by the radar for use by both the transmit and receive sections. The characteristic feature of a coherent MTI radar system is that the transmitted signal is coherent (related in phase) with the reference signal in the receiver. This is achieved by generating the transmitted signal from the COHO. Thus, any radar target simulator must employ the COHO signal in generating simulated target return echoes.

The frequency of the signal output from mixer 38 is $f_{COHO}-f_{IF}$. The signal output from mixer 38, is filtered out leaving only the difference frequency component. The signal output from mixer 38 and the signal output from DDS 12 are heterodyned by a mixer 40. The difference frequency component generated by mixer 40 is filtered out leaving a signal having a frequency of $f_{COHO}-f_{IF}+f_D+f_{IF}$ or simply $f_{COHO}+f_D$, constituting the output of signal generator device 10. Thus, device 10 functions to shift the COHO frequency by the doppler frequency $f_D$. Most importantly, the phase of the output signal from device 10 can be controlled by varying the phase data input to DDS 12.

Figure 2:
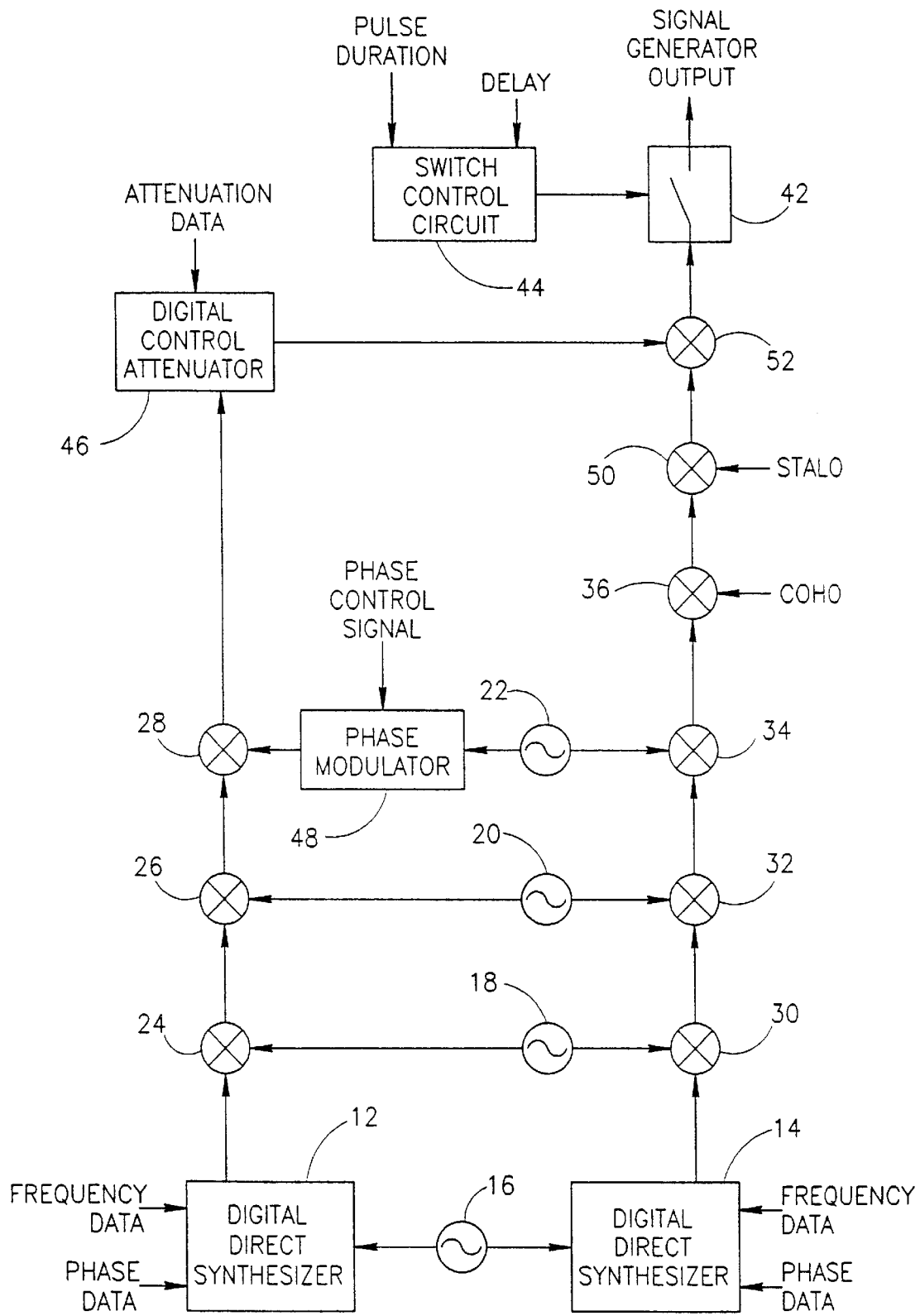
FIG. 2 is a block diagram of an embodiment of the present invention.

In a second embodiment of the present invention the basic concept disclosed in FIG. 1 is expanded upon. At the core of signal generator device 10, shown in FIG. 2, are DDS 12, 14. Both DDS 12, 14 are clocked by oscillator 16. The digital frequency and phase data input to DDS 14 remain constant during operation of device 10 after device 10 is calibrated. The difference between the frequency data input to DDS 12, 14, represented by fD, is the frequency shift which is to appear in the output of signal generator 10. In an MTI radar system, for example, this frequency difference would represent the doppler shift of the simulated return echo signal.

The signals output from DDS 12, 14 are heterodyned with the signal output from an oscillator 18 by mixers 24, 30, respectively. The signals output from mixers 24, 30 are heterodyned with the signal from an oscillator 20 by mixers 26, 32, respectively. The signal output from mixer 32 is heterodyned with the signal from an oscillator 22 by a mixer 34. The signal output from mixer 34 has a frequency $f_{IF}$. The signal output from mixer 26 is heterodyned with the signal from oscillator 22 by mixer 28 after the signal from oscillator 22 has passed through a phase modulator 48. Phase modulator 48 functions to control the phase of the signal output from oscillator 22 in response to a phase control signal. The phase of the signal output from oscillator 22 may be modulated to generate a phase shift keyed (PSK) signal. The signal output from mixer 28 has a frequency $f_{IF}+f_D$. Oscillators 28, 20, 22 may be either analog or digital in form. The function of oscillators 18, 20, 22 is to keep spurious signals to a minimum, during the up conversion process, but are not essential to the operation of device 10.

The output of mixer 34 is heterodyned with a COHO signal by a mixer 36. The sum frequency component of the signal output from mixer 36 is filtered out leaving a signal having a frequency $f_{IF}-F_{COHO}$. The signal output from mixer 36 is heterodyned with a stable oscillator (STALO) signal by mixer 50. The frequency of the STALO+COHO signal is the transmitted RF frequency of the radar (i.e. 2–20 GHz). Mixer 50 performs frequency translation from $F_{COHO}$ to the RF frequency Of $f_{STALO}-f_{IF}+f_{COHO}$. Any phase shift introduced by the STALO signal is cancelled upon reception by the receiver because the STALO signal that generates the transmitted signal also acts as the local oscillator in the receiver. The sum frequency component of the signal output from mixer 50 is filtered out leaving a signal having a frequency $f_{STALO}+f_{COHO}-f_{IF}$.

The signal output from mixer 28 is input to a digital control attenuator (DCA) 46. DCA 46 attenuates the amplitude of the signal output from mixer 28 in accordance with attenuation data input to DCA 46. DCA 46 simulates the reduction in amplitude of the target echo signal, in relation to the transmitted signal, which is due to the effects of wave propagation, etc. The frequency or phase of the signal is not significantly altered by DCA 46. The signals output from DCA 46 and mixer 50 are heterodyned by a mixer 52. The difference frequency component of the heterodyned signal is filtered out leaving a signal having a frequency of $f_{STALO}+f_{COHO}+f_D$. The signal output from mixer 52 is input to a switch 42. Switch 42 has an open, relatively high impedance state and a closed, relatively low impedance state. When switch 42 is in the open state, no signal passes from mixer 52 to the output of device 10. When switch 42 is in the closed state, the signal output from mixer 52 passes to the output of device 10. The pulse width (pulse duration) and time delay of the output signal from device 10 is controlled by a switch control circuit 44. Switch control circuit 44 accepts a pulse duration input and a delay input. The pulse duration input controls the width of the pulse output by switch 42. The delay input controls the timing of the pulse output by switch 42.

Figure 3:
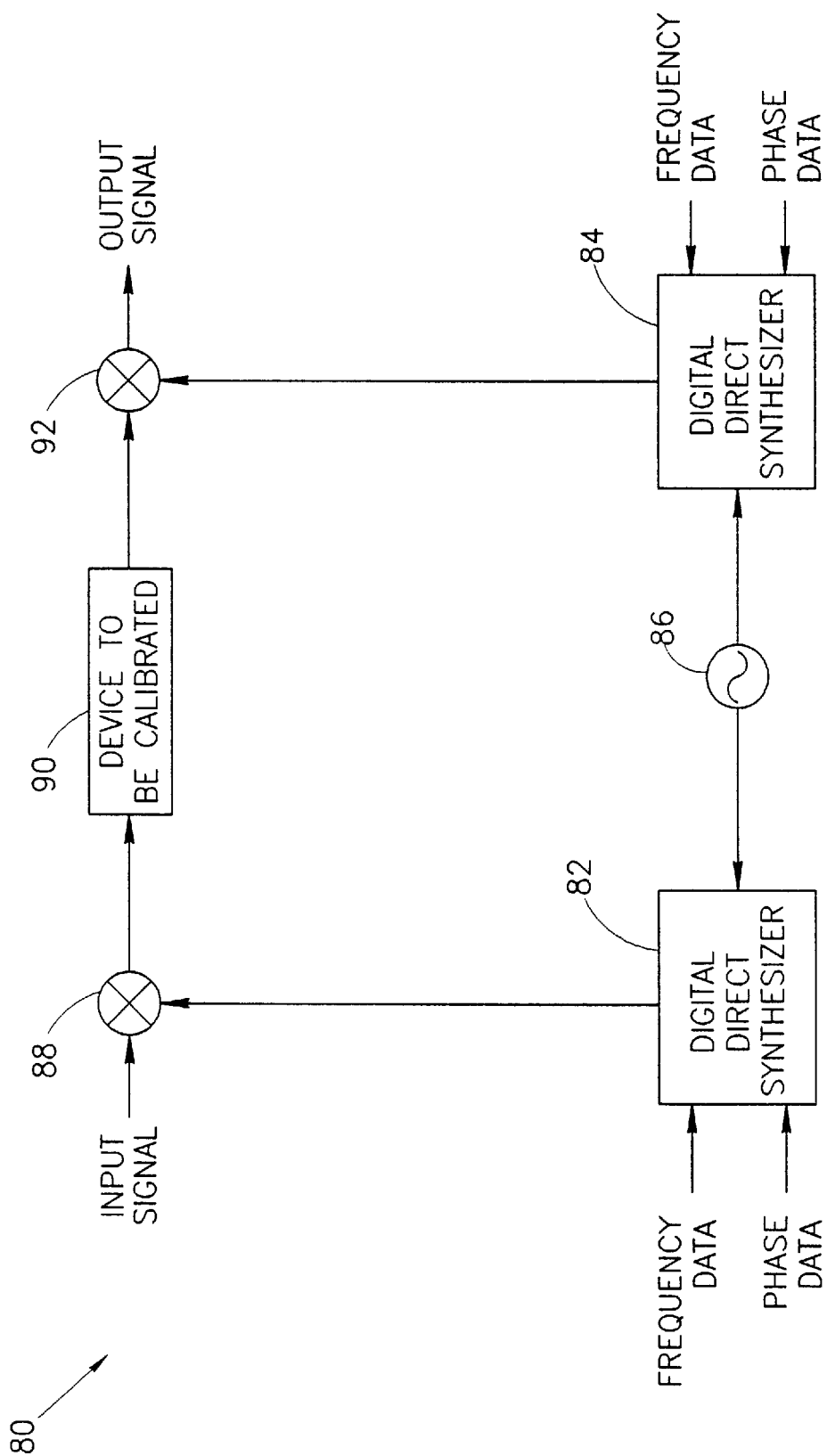
FIG. 3 is a block diagram of an embodiment of the present invention.

A preferred embodiment of the present invention is shown in FIG. 3. The device 80 can be used to perform calibration or compensation of an electrical device 90. DDS 82, 84 are each controlled by separate frequency and phase input data and clocked by a common clock source 86. A signal that would normally be input to electrical device 90 is, instead, an input signal to mixer 88. The input signal may be a pulsed sampled signal from a radar or missile seeker, for example. This input signal is mixed with the output of DDS 82. Mixer 88 down converts the input signal to match the operating frequencies of electrical device 90.

The output of mixer 88 is input to the electrical device 90. Electrical device 90 may be, for example, a variable attenuator or a delay line whose frequency and/or phase characteristics vary either linearly or nonlinearly with some other parameter such as amplitude or attenuation level. The output of electrical device 90 is input to mixer 92. Mixer 90 heterodynes the output of electrical device 90 with the output of DDS 84, so as to up convert the output of electrical device 90. The output of device 80 is the output of mixer 92.

Device 80 is capable of very high accuracy and precision because calibration or compensation occurs at low frequency. Calibration or compensation at high frequency is generally not as accurate and has low resolution. Appropriate frequency and phase data, input to DDSs 82, 84, function to generate an output signal that has a constant phase relative to the phase of the input signal. Thus, any relative phase relationship of the input signal is preserved in the output signal by down converting and up converting using coherent output signals produced by DDSs 82, 84.

The down/up conversion process may have an intermediate conversion step between the input frequency and the DDS output frequency. The down conversion intermediate mixer would be coupled to an intermediate frequency source and placed between mixer 88 and DDS 82. The up conversion intermediate mixer would lie between mixer 92 and DDS 84.

While the invention has been described with respect to a limited number of embodiments, it will be appreciated that many variations, modifications and other applications of the invention may be made.

What is claimed is:

1. A coherent signal generator comprising:
   a first and second frequency synthesizer for producing a first and second synthesizer signal, respectively, said first frequency synthesizer receiving variable frequency and phase input data said first and second frequency synthesizer for controlling the frequency and phase characteristics of said first and second synthesizer signal, respectively;
   a first mixer coupled to a coherent signal source and said second frequency synthesizer, said first mixer for heterodyning a coherent reference signal produced by said coherent signal source with said second synthesizer signal thereby producing a first mixer signal; and
   a second mixer coupled to said first frequency synthesizer and said first mixer, said second mixer for heterodyning said first synthesizer signal with said first mixer signal thereby producing a signal coherent with said coherent reference signal.

2. The coherent signal generator of claim 1, wherein a single clock source provides timing for said first and second frequency synthesizers.

3. Apparatus for controlling and calibrating the phase of a coherent signal comprising:
   a first and second digital direct frequency synthesizer for producing a first and second synthesizer signal, respectively, said first and second frequency synthesizer for controlling the frequency and phase characteristics of said first and second synthesizer signal, respectively;
   a first mixer coupled to an input signal source and said first frequency synthesizer, said first mixer for heterodyning said input signal with said first synthesizer signal thereby producing a signal subsequently input to an electrical device;
   a second mixer coupled to said electrical device and said second synthesizer, said second mixer for heterodyning said second synthesizer signal with the output of said electrical device thereby producing an output signal having a constant phase relative with said input signal.

4. The coherent signal generator of claim 1, wherein said second frequency synthesizer receives fixed frequency and phase input data.

5. The coherent signal generator of claim 1, wherein said first and second synthesizer signals have phase resolutions on the order of millidegrees.

6. A coherent signal generator comprising:
   a first and second frequency synthesizer for synthesizing a first and second synthesizer signal, respectively, said first and second frequency synthesizer for controlling the frequency and phase characteristics of said first and second synthesizer signal, respectively;
   an oscillator for producing an oscillator signal having predetermined frequency characteristics;
   a phase modulator coupled to said oscillator for producing a phase modulated signal;
   a first mixer coupled to said phase modulator and said first frequency synthesizer, said first mixer for heterodyning said phase modulated signal with said first synthesizer signal thereby producing a first mixer signal;
   a second mixer coupled to said oscillator and said second frequency synthesizer, said second mixer for heterodyning said oscillator signal with said second synthesizer signal thereby producing a second mixer signal;
   an attenuator coupled to said first mixer for producing an attenuated signal;
   a third mixer coupled to a coherent signal source and said second mixer, said third mixer for heterodyning a coherent reference signal produced by said coherent signal source with said second mixer signal thereby producing a third mixer signal;
   a fourth mixer coupled to a stable oscillator signal source and said third mixer, said forth mixer for heterodyning a stable oscillator signal produced by said stable oscillator signal source with said third mixer signal thereby producing a forth mixer signal;
   a fifth mixer coupled to said attenuator and said forth mixer, said fifth mixer for heterodyning said attenuator signal with said forth mixer signal thereby producing a fifth mixer signal;
   a switch coupled to said fifth mixer having an open state and a closed state, said switch outputting said fifth mixer signal only when said switch is in said closed state; and
   a switch control circuit for controlling when said switch is in said closed state.

7. The coherent signal generator of claim 6, wherein a single clock source provides timing for said first and second frequency synthesizers.

8. The coherent signal generator of claim 6, wherein said first frequency synthesizer receives variable frequency and phase input data.

9. The coherent signal generator of claim 6, wherein said second frequency synthesizer receives fixed frequency and phase input data.

10. The coherent signal generator of claim 6, wherein said first and second synthesizer signals have phase resolutions on the order of millidegrees.

11. The coherent signal generator of claim 6, wherein said phase modulator produces a phase shift keyed signal.

12. Apparatus for controlling and calibrating the phase of a coherent signal comprising:
    a first and second frequency synthesizer for producing a first and second synthesizer signal, respectively, said first frequency synthesizer receives variable frequency and phase input data, said first and second frequency synthesizer for controlling the frequency and phase characteristics of said first and second synthesizer signal, respectively;

a first mixer coupled to a coherent signal source and said second frequency synthesizer, said first mixer for heterodyning a coherent reference signal produced by said coherent signal source with said second with said second synthesizer signal thereby producing a first mixer signal; and a second mixer coupled to said first frequency synthesizer and said first mixer, said second mixer for heterodyning said first synthesizer signal with said first mixer signal thereby producing a signal coherent with said coherent reference signal.

13. The apparatus of claim 12, wherein said second frequency synthesizer receives fixed frequency and phase input data.

14. The apparatus of claim 12, wherein a single clock source provides timing for said first and second frequency synthesizers.

15. The apparatus of claim 12, wherein said first and second synthesizer signals have phase resolutions on the order of millidegrees.

* * * * *